US007884595B2

(12) United States Patent
Brunner et al.

(10) Patent No.: US 7,884,595 B2
(45) Date of Patent: Feb. 8, 2011

(54) METHOD FOR PRODUCING AN ELECTRICITY SENSING DEVICE

(75) Inventors: Markus Brunner, Bessenbach (DE); Martin Kehlenbach, Grosswallstadt (DE)

(73) Assignee: Vacuumschmelze GmbH & Co. KG, Hanau (DE)

( * ) Notice: Subject to any disclaimer, the term of this patent is extended or adjusted under 35 U.S.C. 154(b) by 83 days.

(21) Appl. No.: 12/466,057

(22) Filed: May 14, 2009

(65) Prior Publication Data

US 2010/0090678 A1 Apr. 15, 2010

(30) Foreign Application Priority Data

Oct. 14, 2008 (DE) ...................... 10 2008 051 561

(51) Int. Cl.
*G01R 19/00* (2006.01)

(52) U.S. Cl. .................................................. 324/76.11

(58) Field of Classification Search ................. 324/765, 324/158.1, 117 R, 117 H, 126, 72.5, 76.11; 702/62, 64; 336/173, 192; 323/294, 368
See application file for complete search history.

(56) References Cited

U.S. PATENT DOCUMENTS

| | | | | |
|---|---|---|---|---|
| 4,494,068 | A * | 1/1985 | Ley et al. | 324/126 |
| 4,887,028 | A | 12/1989 | Voisine et al. | |
| 5,565,765 | A | 10/1996 | Lenhard | |
| 6,028,422 | A | 2/2000 | Preusse | |
| 6,078,172 | A | 6/2000 | Lenhard | |
| 6,218,825 | B1 | 4/2001 | Lenhard | |
| 6,507,262 | B1 | 1/2003 | Otte et al. | |
| 6,563,411 | B1 | 5/2003 | Otte et al. | |
| 6,580,347 | B1 | 6/2003 | Otte et al. | |
| 6,624,622 | B2 * | 9/2003 | Noh | 324/72.5 |
| 6,788,046 | B2 | 9/2004 | Lenhard et al. | |
| 6,794,860 | B2 | 9/2004 | Schafer | |
| 7,057,485 | B2 | 6/2006 | Preusse et al. | |
| 7,358,716 | B2 | 4/2008 | Preusse et al. | |
| 7,358,844 | B2 | 4/2008 | Guenther et al. | |
| 7,400,131 | B2 | 7/2008 | Preusse | |

FOREIGN PATENT DOCUMENTS

| | | |
|---|---|---|
| WO | WO 00/17897 | 3/2000 |
| WO | WO 00/30131 | 5/2000 |
| WO | WO 00/30132 | 5/2000 |

* cited by examiner

*Primary Examiner*—Ha Tran T Nguyen
*Assistant Examiner*—Tung X Nguyen
(74) *Attorney, Agent, or Firm*—Buchanan Ingersoll Rooney PC

(57) ABSTRACT

A method for producing an electricity sensing device with a one-piece, U-shaped bent current conductor of a certain length having a middle portion and two end portions and comprising in the middle portion the form of a rod having a non-rectangular conductor cross-section and featuring flats having a rectangular conductor cross-section in its end portions, and arranged in the middle portion a magnetic module comprising a lead-through for mounting the current conductor, the method comprising the steps: providing the magnetic module as well as a current conductor configured straight and rod-shaped in the middle portion and in at least one of the end portions; tin-coating the current conductor at least partly in at least one end portion; positioning the current conductor and the magnetic module relative to each other such that the current conductor is located in the lead-through of the module by its middle portion, and shaping the current conductor into a U with flattened ends.

18 Claims, 2 Drawing Sheets

METHOD FOR PRODUCING AN ELECTRICITY SENSING DEVICE

BACKGROUND

1. Field

Disclosed herein is a method for producing an electricity sensing device such as, for example, an electricity meter or energy meter.

2. Description of Related Art

A variety of electronic electricity meters (or electric meters in US parlance) is known for sensing electricity or energy which are now increasingly taking the place of the mechanical Ferraris meters in industry and domestic applications and which implement electricity sensing by mechanical and electrical assemblies in diverse configurations. In addition to electricity sensing by means of measuring shunts, Rogowski coils or Hall elements, current transformers based on soft magnetic ring cores, especially ring band cores, are popular as magnetic modules in electricity meters. A magnetic module (current transformer) DC decouples the power to furnish a precise measurand in the form of a signal voltage across a burden resistor. The requirements as to the accuracy of amplitude and phasing and linearity are specified by IEC 62053, -21, -23, formerly 1036 in Europe, and ANSI C12.xx in the USA as cited, for example, in the company prospectus "VAC current transformers for electronic energy meters" of the German firm Vacuumschmelze, published October 1998. Current transformers for electronic energy meters are also cited generally in the company prospectus "Current transformers for electronic energy meters" of the firm Vacuumschmelze, published 2002. Such electricity meters employing current transformers (also termed Watthour meters) serve as officially approved means of measuring the electrical current representing the energy consumption as billed by power utilities.

A busbar structure forming so-called primary conductors together with a compatible ring core current transformer for sensing the consumption amperage are typically used. Plug-in electric meters popular in the USA and other countries feature standardized rear rectangular terminals for plugging into mating spring contacts when mounting the meter. These contacts, with a cross-section of approximately a×2.5 mm serve to input and output the consumption amperage, which on 110 V systems amounts to a maximum of approximately 200-480 $A_{rms}$. Factor "a" represents the thickness of the cross-section and is set at a=19 mm for a maximum current of $I_{max}$=320 A. It is usually the case that the currents of the three phases of the AC power grid are conducted into the electricity meter through an electricity sensing system and back out of the electricity meter.

The current transformer may be configured so that a busbar dimensioned 19×2.5 mm, for example, can be inserted through a hole in the interior of the current transformer. The portion of the busbar for mounting the current transformer may also have a round cross-section so that the hole in the current transformer can be dimensioned smaller, making it possible to use a smaller and less costly ring band core. Even though the time required to produce the core and make the windings is the same, the processing steps involved in heat treatment and coating become all the more favorable the smaller the diameter of the core. Producing a busbar suitable for this purpose is done by providing a U-shaped assembly of conductors with diverse portions. A central connecting portion having a round cross-section serves as the element of the current transformer for passing through the corresponding opening in the core. Two terminal portions having a rectangular cross-section serve to connect the current conductor in the form of plug-in connectors known as such, as already explained above.

When fitting the current transformer to a one-piece primary conductor it is a mandatory requirement to mount the inductive transformer on the primary conductor together with the terminal contacts thereof. This automatically results in the minimum inner diameter of the magnetic transformer being dictated by the size of the plug-in contact for a primary conductor made in one piece.

Although it is possible to adapt the inner diameter of the inductive current transformer to the minimum possible by the electromagnetic design, when the primary conductor comprises a plurality of separate parts, this adds to the complications in assembling the primary busbar. The conductor assembly in this arrangement is made up of three metal parts each differing in cross-section from the other, the two ends of the current conductor needing to be secured to the flats of the rectangular connecting leads. The methods as usual for jointing busbars made up of three separate parts, for example, are brazing and welding. Both of these methods make it necessary to protect the current transformer from the heat generated in jointing, this in turn necessitating complicated designs with cooling clamps between the jointing location and current transformer.

Another drawback of these methods is the highly restricted possibility of checking proper jointing. Indeed, checking the joint for absolute assurance is only possible by destructive testing. In addition to this, there is a risk of electrochemical corrosion of the joint due to the difference in the normal potentials of the alloys used, as is especially the case with brazed connections depending on the combination of solder and conductor material employed. This risk is especially to be avoided where outdoor energy meters are involved, as is usual in the NAFTA area, where the influence of moisture, possibly in combination with industrial toxic emissions such as e.g. $NO_x$ or $SO_x$ compounds is to be reckoned with.

To get round these difficulties involved in thermal jointing methods it was proposed, for example, in German patent DE 10 2004 058 452, to implement jointing by cold-press welding. Although this method avoids the heating-up of the joint, the resulting joints of the separate components of the primary conductor have other disadvantages. For instance, only a fraction of the terminal pad comprises cold-press welded material. The majority of the connecting surface is merely positively connected, resulting in a micron air gap remaining between the partners of the joint. This air gap reduces the current-carrying capacity of the joint, resulting in the risk of the joint becoming over-heated when the conductor is loaded to a maximum.

The connections of such a conductor assembly of three elements having cross-sections, each differing from the other at the points of connection, are intended to reliably achieve a long life of, for example, 10-15 years, thus demanding the processes in fabricating the conductor assembly to be safe and sound. For good electrical conductivity the corresponding busbars or conductor assemblies are mainly structured in a copper material, causing problems, however, both with brazing and welding, particularly due to the heat in making the joints, because copper is a good thermal conductor, so that the heat is transmitted by the current conductor to the current transformer, risking damage thereto.

SUMMARY

Disclosed herein is a method for producing an electricity sensing device which assures simple fabrication for a safer connection with minimum load on the other components.

In one embodiment, the method disclosed herein is a method for producing an electricity sensing device with a one-piece, U-shaped bent current conductor of a certain length having a middle portion and two end portions and comprising in the middle portion the form of a rod having a non-rectangular conductor cross-section and featuring flats having a rectangular conductor cross-section in its end portions, and, arranged in the middle portion, a magnetic module comprising a lead-through for mounting the current conductor comprises the steps:

providing the magnetic module as well as a current conductor configured straight and rod-shaped in the middle portion and in at least one of the end portions;

tin-coating the current conductor at least partly in at least one end portion;

positioning the current conductor and the magnetic module relative to each other such that the current conductor is located in the lead-through of the module by its middle portion, and shaping the current conductor into a U with flattened ends.

One advantage of the method described herein is the clever combination of enhancing the reliability in optimizing the current-carrying capacity of a primary conductor made in one-piece and minimizing the size of the magnetic module due to making optimum use of the cross-sections of the current conductor and lead-through.

In another embodiment is disclosed the one-piece, U-shaped bent current conductor of a certain length having a middle portion in the form of a rod having a non-rectangular conductor cross-section, and two end portions each having a flat portion of a rectangular cross-section, and a magnetic module comprising a lead-through for mounting the current conductor and arranged on the middle portion of the current conductor such that the middle portion of the current conductor passes through the lead-through, produced by the process as set forth above.

BRIEF DESCRIPTION OF DRAWINGS

The method and apparatus will now be detailed by way of example embodiments as shown in the FIGs. of the drawing in which.

DETAILED DESCRIPTION OF SPECIFIC EMBODIMENTS

Figure 1:
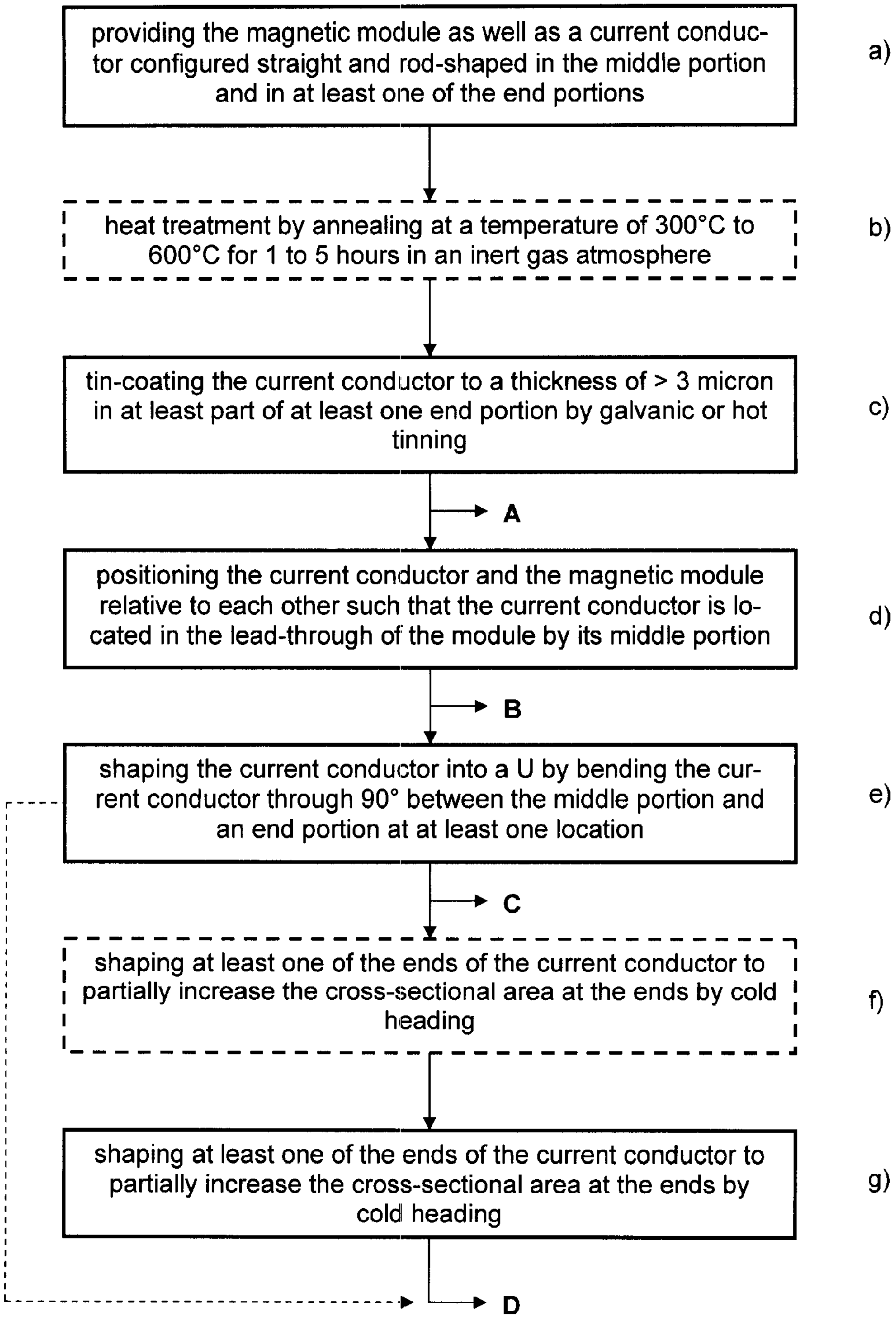
FIG. 1 is a flow diagram relating to one embodiment of producing an electricity sensing device and FIG. 2 is a series of prospective views (2A to 2D) showing various intermediate products resulting from production according to an embodiment of the method described herein, including a fully assembled electricity sensing device.

Referring now to FIG. 1 a flow diagram of the novel method of production is illustrated as an example, the end product of which is, for example, a current transformer, a current sensor or the like.

Figure 2:
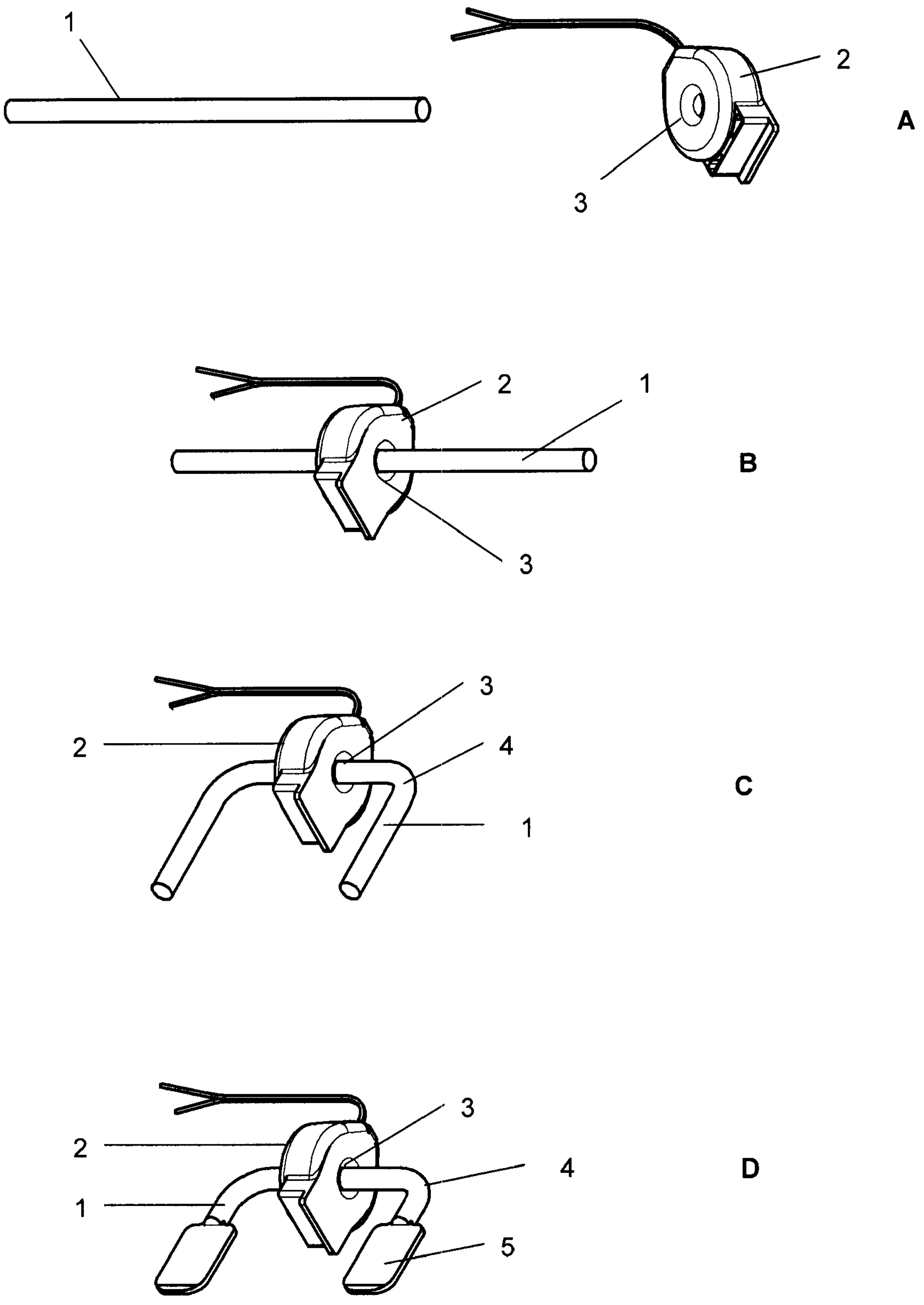

FIG. 2 illustrates one such end product denoted "D". This electricity sensing device comprises, as shown, a one-piece U-shaped bent current conductor 1 of a certain length having a middle portion and two end portions and comprising in the middle portion the form of a rod having a non-rectangular conductor cross-section and featuring flats 5 having a rectangular conductor cross-section in its end portion. Provided furthermore is a magnetic module 2 arranged in the middle portion of the current conductor 1 (also termed primary conductor in accordance with its function) comprising a lead-through 3 receiving the current conductor. Such a module may include, as shown, at least one wound ring core and, depending on the circumstances, also an electronic circuit, such as, for instance, a semiconductor circuit.

Reverting back to FIG. 1 there is illustrated how in the novel method of production the first step a) involves providing the magnetic module, as well as a current conductor that is configured straight and rod-shaped in the middle portion and in at least one of the end portions, here made of pure copper, but which may also be made of a copper alloy, aluminum, an aluminum alloy or any other comparable material.

In an optional (denoted by the dotted box) step b) heat treatment is performed, annealing the current conductor, for example, at a temperature of 300° C. to 600° C. for 1 to 5 hours in an inert gas atmosphere.

In a step c) the current conductor is tinned to a thickness of at least 3 micron. The tinning may be over the full length, or over just part of an end portion, or over both end portions (depending on the preceding intermediate product). Tinning may be conducted by galvanic or hot tinning which can thus cover the whole current conductor, one or both end portions fully or also just partly. The result is then current conductor illustrated as part of the starting product A as shown in FIG. 2. In this example it is assumed that the current conductor is provided as a fully straight, rod-shaped current conductor having a round cross-section which is then heat-treated and tinned. However, this could just as well be assumed to be a current conductor already heat-treated and, where necessary, already tinned fully or in part and which, in addition, may have an end portion which is already bent or flattened. The steps as described hereinafter are applicable just the same for such starting products, requiring just the one remaining end portion of the current conductor to be worked instead of both end portions. In this respect, the tinning step is also optical, e.g. where the current conductor is supplied already tinned.

In a step d) the current conductor and the magnetic module are positioned relative to each other such that the current conductor is located in the lead-through of the module by its middle portion. This step results in an intermediate product B as shown in FIG. 2.

In a step e) the current conductor is shaped into a U by bending the current conductor to an angle of 90° between the middle portion and an end portion or between the middle portion and each end portion, depending on the intermediate product B. The result is an intermediate product C as shown in FIG. 2 in which a bend of 90° results at two locations 4, each between the middle portion and an end portion.

In an optional step f) at least one of the two ends of the current conductor is shaped to partially increase the cross-sectional area at the ends by cold heading, for instance, when a cross-sectional area is required greater than is achievable with the cross-section of the starting product.

In step g) concluding the method, one end within one or both current conductors is shaped into flattened ends, resulting in the final product D by cold pressing. It is to be noted that the sequence of steps e), g) or e), f), g) can also be changed so that step e) first occurs after g).

Thus, in the example described above it is provided for that a current conductor 1 (primary conductor) having a non-rectangular and for a given cross-section a minimum, for example, round circumference is furnished. Depending on the material used for the conductor heat treatment is firstly scheduled with the object of optimally conditioning the material for the necessary shaping procedure. When, for example, copper is used as the material it is particularly of advantage to subject this to annealing this between approximately 300 and 600° C. for approximately one to five hours in a neutral inert gas atmosphere. If pure aluminum is used as the conductor material there is no need for this heat treatment.

The thus prepared current conductor 1 is then tin-coated using either a galvanic or a hot tin-coating technique to a minimum thickness of 3 micron. It was surprisingly discovered that tin coatings in general, and especially with at least a thickness in conjunction with the conductor materials come into consideration for this application when shaping the terminal pads of the current conductor by cold pressing, constitute an exceptionally effective lubricant. These tin coatings minimize the work needed to shape the current conductor, improve the contour accuracy of the parts and make it possible to use smaller and thus less costly shaping presses. For another thing, it is likewise surprising that after shaping, these tin coatings remain intact as closed coatings free of any defects after shaping, thus assuring the necessary corrosion protection and good electrical contactability of the terminal pads.

These two properties are a salient requirement for producing the electricity sensing devices as described presently; otherwise the coating needed for a reliably safe contacting would have to be subsequently produced by hot or galvanic tinning. Subsequent galvanic tinning would create the problem that the module 2 already mounted with the current conductor needs to be protected from the complete process chemistry involved galvanically which is highly complicated. Hot tinning the mounted current transformer assembly would pose the problem of the sensitive module 2 being exposed to thermal stress, necessitating equally complicated measures with cooling clamps as when fabricating the current conductor from a plurality of separate parts. On top of this, it would also be practically impossible to maintain the specified tight mechanical tolerances of the terminal pads during a process involving hot tinning.

The inductive transformer is then mounted on the current conductor 1 prepared as above and presently in an extended condition before the two ends of the conductor are bent at right angles corresponding to the spacing of the terminal pads (for example in compliance with the ANSI standard). The thus prepared current conductor 1 together with the module 2 is then placed in a press die and the two flats 5 of the current conductor 1 serving as terminal pads are then cold extruded either separately or together from the ends of the current conductor 1.

In a particular embodiment, the ends of the current conductor are flattened into a rectangular cross-section (at least one of which ends are flattened during the shaping of the current conductor after receiving the magnetic module), such that the rectangular cross-section has a longer edge and a shorter edge, wherein the longer edge has a length that is greater than the largest diameter of the lead-through of the magnetic module.

In another particular embodiment, the middle portion of the current conductor has a round cross-section having a diameter that is, at its largest, 0.5 to 20% smaller than the smallest diameter of the lead through of the magnetic module.

The method as presented now makes it possible to achieve terminal pads which, after shaping, feature a closed tin-coated surface which, for one thing, offers excellent protection from corrosion and, for another, optimizes electrical contacting the current conductor 1 to a given electric facility.

By eliminating all jointing, the process disclosed herein now makes for added freedom of choice in selecting the conductor material. Where a current bar is produced by a jointing process involving brazing or welding, because of the jointing involved, copper is practically the only material available for the conductor. By contrast, when a current bar is fabricated in one piece using the process described herein, much cheaper aluminum can be used for its production. Indeed, the mechanical properties of aluminum, especially the low yield strength of pure aluminum is greatly conducive to the method described herein involving extruding or cold pressing the terminal pads.

With aluminum too, tinning at least the portion of the terminal pads to be later finish-formed offers the advantage of an even better result in shaping due to the lubricating effect of the tin coating along with good corrosion protection and excellent electrical contactability of the terminal pads.

Achieving a conductor cross-section of the terminal pads in compliance with the ANSI standard (2.5×19 mm) necessitates the conductor, before shaping, having a corresponding cross-sectional area, as is the case with a conductor diameter of 7.7 mm of round cross-section. When copper is used as the conductor material, a conductor having this cross-section has a current-carrying capacity of approximately 320 $A_{rms}$ corresponding to a typical current-carrying capacity of the 110 V system in the NAFTA area, whereas using aluminum as an alternative achieves a current conductor having a current-carrying capacity of approximately 200 $A_{rms}$ which is likewise a current-carrying capacity typical for single-phase energy meters especially for applications in the domestic field.

When current conductors are selected with deviating cross-sectional areas, the lack or excess of material for the conductor in the shaping portion can be offset by suitable means. For instance, when conductors having a cross-section smaller than approximately 45 $mm^2$ are used, the ends of the conductor can first be thickened, e.g. by cold heading to the required cross-section, after which the terminal pads are extruded as described above.

To produce a current transformer module for a maximum current-carrying capacity of 320 $A_{rms}$, a rod of copper 7.7 mm in diameter is used as the conductor material which is straightened and cut to length to form a bendable, annealed, hot-tinned wire of this diameter. The metallic bright ends of the wire after it has been cut to length are then tinned in a tin bath at a temperature between 350 and 400° C. with pure tin, a $SnCu_{0.7-3.0}$ alloy, a tin-silver-copper alloy, or with other tin-based alloys, to create the tin coating. An inductive current transformer, for instance as described in European patent EP-A 1 131 830, having an inner diameter of 9 mm, is then mounted on the thus prepared current conductor. This is followed by both ends of the conductor being bent at right angles, resulting in a U-shaped conductor having a leg spacing averaging approximately 75 mm. The thus prepared U-shaped current conductor is inserted in an extruder die and the two terminal pads measuring 2.5×19 mm are cold extruded directly from this current conductor. It is in this condition that the electricity sensing device is ready for installation in producing an electronic energy meter.

To produce a current transformer module for a maximum current-carrying capacity of 200 $A_{rms}$, a rod of pure aluminum 7.7 mm in diameter is used as the conductor material which is straightened and cut to length to furnish a wire of this diameter. After the wire is cut to length, each is galvanically coated in an acidic electrolyte containing a complex fluoride with a coating of pure tin, to a coating thickness of 15 micron. An inductive current transformer, for instance as described in EP 1 129 459, having an inner diameter of 10 mm, is then mounted on the thus prepared current conductor. This is followed by both ends of the conductor being bent at right angles, resulting in a U-shaped conductor having a leg spacing averaging approximately 75 mm. The thus prepared U-shaped current conductor is inserted in an extruder die and the two terminal pads measuring 2.5×19 mm are cold extruded directly from this current conductor. It is in this condition that the electricity sensing device is ready for installation in producing an electronic energy meter.

An electronic circuit in the electricity meter senses the current and calculates from the amperage (including the phasing where necessary) the energy consumption as is described, for example, in U.S. Pat. No. 4,887,028.

Low-cost production of a magnetic module for sophisticated current transformers is achieved by using ring cores, particularly ring band cores and winding the insulated or encapsulated cores with the corresponding secondary winding on the basis of varnished copper wire. Suitable cores for this purpose are known for example from EP 1 131 830 and EP 1 129 459, EP 1 114 429 describing current transformers for such purposes.

The invention having been described herein with respect to certain specific embodiments, it will be understood that these specific embodiments are illustrative, and not limiting of the appended claims.

The invention claimed is:

1. A method for producing an electricity sensing device, the device comprising:

a one-piece, U-shaped bent current conductor of a certain length having a middle portion in the form of a rod having a non-rectangular conductor cross-section, and two end portions each having a flat portion of a rectangular cross-section, and a magnetic module comprising a lead-through for mounting the current conductor and arranged on the middle portion of the current conductor such that the middle portion of the current conductor passes through the lead-through, the method comprising:

providing a magnetic module comprising a lead-through having a diameter sufficient to receive the current conductor;

providing a current conductor having a middle portion and two end portions, configured as a straight rod in the middle portion and in at least one of the end portions, and at least partially tin-coated with pure tin or with a coating containing tin, on at least one end portion;

positioning the current conductor and the magnetic module relative to each other such that the current conductor is located in the lead-through of the module at the middle portion of the current conductor, and shaping the current conductor into a U-shape having ends each having a flattened portion of rectangular cross-section.

2. The method as set forth in claim 1 wherein the current conductor comprises aluminum or an aluminum alloy.

3. The method as set forth in claim 1 wherein the current conductor comprises copper or a copper alloy.

4. The method as set forth in claim 3 further comprising annealing the current conductor at temperatures between 300° C. and 600° C. for a duration of 1 to 5 hours and tin-coating the resulting annealed current conductor.

5. The method as set forth in claim 4 wherein annealing is done in an inert gas atmosphere.

6. The method as set forth in claim 1 wherein the tin-coated current conductor comprises a tin coating that is at least 3 micron thick.

7. The method as set forth in claim 1 wherein the tin-coated current conductor is obtained by applying the tin coating galvanically or by hot tinning.

8. The method as set forth in claim 1, wherein shaping of the current conductor comprises cold extruding one end in at least one end portion.

9. The method as set forth in claim 1, wherein the shaping comprises bending the current conductor to an angle of 90° between the middle portion and at least one end portion.

10. The method as set forth in claim 1, wherein the rectangular cross-section comprises a longer edge length that is greater than the largest diameter of the lead-through of the magnetic module.

11. The method as set forth in claim 1, further comprising cold-heading one or more ends of the current conductor before the shaping.

12. The method as set forth in claim 1 wherein the middle portion of the current conductor has a diameter that is, at its largest, 0.5 to 20% smaller than the smallest diameter of the lead-through of the magnetic module.

13. The method as set forth in claim 1, wherein the current conductor and the lead-through each have a round cross-sectional shape.

14. The method as set forth in claim 1, wherein the magnetic module comprises a wound ring core through which the current conductor is guided.

15. The method as set forth in claim 14, wherein the magnetic module further comprises an electronic circuit.

16. The method as set forth in claim 1, wherein the current conductor is provided as a pre-annealed, tin-coated rod having one end shaped and another end and middle portion configured as a straight rod.

17. An electricity sensing device, the device comprising:

a one-piece, U-shaped bent current conductor of a certain length having a middle portion in the form of a rod having a non-rectangular conductor cross-section, and two end portions each having a flat portion of a rectangular cross-section, and a magnetic module comprising a lead-through for mounting the current conductor and arranged on the middle portion of the current conductor such that the middle portion of the current conductor passes through the lead-through, produced by the process as set forth in claim 1.

18. The electricity sensing device as set forth in claim 17, wherein the device is a current transformer or a current sensor.

* * * * *